(12) United States Patent
Hu et al.

(10) Patent No.: US 10,699,939 B2
(45) Date of Patent: Jun. 30, 2020

(54) FINFET SEMICONDUCTOR STRUCTURE WITH EQUAL PITCHES AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hua Yong Hu, Shanghai (CN); Yi Shih Lin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 6 days.

(21) Appl. No.: 15/961,621

(22) Filed: Apr. 24, 2018

(65) Prior Publication Data

US 2018/0308746 A1 Oct. 25, 2018

(30) Foreign Application Priority Data

Apr. 24, 2017 (CN) .......................... 2017 1 0273276

(51) Int. Cl.
*H01L 21/762* (2006.01)
*H01L 21/308* (2006.01)
(Continued)

(52) U.S. Cl.
CPC .... *H01L 21/76232* (2013.01); *H01L 21/3086* (2013.01); *H01L 29/6681* (2013.01); *H01L 29/66795* (2013.01); *H01L 21/3065* (2013.01); *H01L 21/31111* (2013.01); *H01L 21/31116* (2013.01); *H01L 27/0886* (2013.01)

(58) Field of Classification Search
CPC combination set(s) only.
See application file for complete search history.

(56) References Cited

U.S. PATENT DOCUMENTS 7,759,239 B1 * 7/2010 Lin ...................... H01L 21/0337
257/E21.218
8,703,557 B1 * 4/2014 Cai ...................... H01L 29/6681
257/347

(Continued)

*Primary Examiner* — Allen L Parker
*Assistant Examiner* — Gustavo G Ramallo
(74) *Attorney, Agent, or Firm* — Anova Law Group, PLLC

(57) ABSTRACT

Semiconductor structure and fabrication method are provided. The method includes: providing a substrate including device regions and isolation regions, adjacent with one another; providing discrete fins on the substrate, pitches between adjacent fins being substantially same; forming a protective layer on the sidewalls of the fins; removing a partial thickness of the fins in the isolation regions along with a partial thickness of the protective layer in the isolation regions by a first etching process; forming dummy fins by a second etching process to etch the remaining fins in the isolation regions using the remaining protective layers as a mask; removing the remaining protective layer after the second etching process; and forming isolation structures in the isolation regions on the substrate. The isolation structures have a top lower than the fins in the device regions and higher than the dummy fins in the isolation regions.

19 Claims, 6 Drawing Sheets

(51) Int. Cl.
    *H01L 29/66*     (2006.01)
    *H01L 21/3065*   (2006.01)
    *H01L 27/088*    (2006.01)
    *H01L 21/311*    (2006.01)

(56) References Cited

U.S. PATENT DOCUMENTS

| | | | |
|---|---|---|---|
| 9,704,974 B2 * | 7/2017 | Chang | H01L 29/66795 |
| 2005/0124101 A1 * | 6/2005 | Beintner | H01L 21/823437 |
| | | | 438/197 |
| 2007/0278578 A1 * | 12/2007 | Yoshida | H01L 21/845 |
| | | | 257/347 |
| 2013/0309838 A1 * | 11/2013 | Wei | H01L 21/76229 |
| | | | 438/424 |
| 2014/0138773 A1 * | 5/2014 | Cheng | H01L 21/3086 |
| | | | 257/347 |
| 2015/0024572 A1 * | 1/2015 | Jacob | H01L 21/76243 |
| | | | 438/404 |
| 2015/0064912 A1 * | 3/2015 | Jang | H01L 21/3086 |
| | | | 438/696 |
| 2015/0294976 A1 * | 10/2015 | Kim | H01L 27/1104 |
| | | | 438/702 |
| 2016/0056045 A1 * | 2/2016 | Huang | H01L 21/3065 |
| | | | 257/623 |
| 2016/0093726 A1 * | 3/2016 | Ching | H01L 29/785 |
| | | | 257/192 |
| 2016/0308027 A1 * | 10/2016 | Chang | H01L 21/3086 |

* cited by examiner

FINFET SEMICONDUCTOR STRUCTURE WITH EQUAL PITCHES AND FABRICATION METHOD THEREOF

CROSS-REFERENCES TO RELATED APPLICATION

This application claims the priority of Chinese Patent Application No. 201710273276.0, filed on Apr. 24, 2017, the content of which is incorporated herein by reference in its entirety.

TECHNICAL FIELD

The present disclosure generally relates to the field of semiconductor technologies and, more particularly, relates to a semiconductor structure for a fin field effect transistor and its fabrication method.

BACKGROUND

In the field of semiconductor fabrication, critical dimensions of integrated circuits continuously decrease with development of ultra-large scale integration (VLSI). To better adapt to the decreased critical dimensions, lengths of channels in metal-oxide-semiconductor field-effect transistors (MOSFETs) also continuously decrease. However, a distance between a source and a drain of a device also decreases when the channel length decreases. Correspondingly, the controlling ability of the gate structure over the channel becomes worse, and it also becomes harder for the gate voltage to pinch off the channel. As a result, sub-threshold leakage, also known as a short-channel effect (SCE), may easily occur.

To better adapt to the decreased critical dimensions of the devices, the semiconductor process has been gradually transferred from planar MOSFETs to more efficient non-planar three-dimensional transistors, such as fin field effect transistors (FinFETs). In an FinFET, the gate structure is able to control an ultra-thin part (fin) from two sides of the fin, to provide a much stronger controlling ability on the channel and to effectively suppress the short-channel effect compared to the planar MOSFETs. Moreover, compared with other devices, FinFET is more compatible with the present fabrication processes for integrated circuits.

However, the performance of conventionally fabricated FinFET devices still needs to be improved. The disclosed devices and methods are directed to at least partially alleviate one or more problems set forth above and to solve other problems in the art.

SUMMARY

One aspect of the present disclosure provides a fabrication method of a semiconductor structure. The method includes: providing a substrate including device regions and isolation regions, adjacent with one another; providing discrete fins on the substrate, pitches between adjacent fins being substantially same; forming a protective layer on the sidewalls of the fins; removing a partial thickness of the fins in the isolation regions along with a partial thickness of the protective layer in the isolation regions by a first etching process; forming dummy fins by a second etching process to etch the remaining fins in the isolation regions using the remaining protective layers as a mask; removing the remaining protective layer after the second etching process; and forming isolation structures in the isolation regions on the substrate. The isolation structures have a top lower than the fins in the device regions and higher than the dummy fins in the isolation regions.

Another aspect of the present disclosure provides a semiconductor structure. The semiconductor structure includes: a substrate including device regions and isolation regions, adjacent to one another; discrete fins on the substrate having pitches between adjacent fins substantially same; dummy fins on the substrate in each isolation region, wherein the dummy fins have a top lower than an adjacent fin in the device region; and an isolation structure in each isolation region, on the substrate, and between fins in the device regions. The isolation structure has a top lower than the fins in the device regions and higher than the dummy fins in the isolation regions.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference may now be made in detail to exemplary embodiments of the disclosure, which are illustrated in the accompanying drawings. Wherever possible, the same reference numbers may be used throughout the drawings to refer to the same or like parts.

As critical dimensions of semiconductor devices continue to decrease, a self-aligned technology, such as a self-aligned double patterned method (SADP), is used to form fins in semiconductor devices, to effectively fill gaps in the lithography of smaller nodes, and to improve the minimum pitch between adjacent semiconductor graphics, the liner width roughness (LWR) and the liner edge roughness (LER).

The pattern density of each region in the substrate is not exactly same according to the actual layout design, and the substrate includes dense areas and ISO areas according to the pattern density on the substrate surface. Correspondingly, the pitches between adjacent fins are not exactly the same.

Figure 1:
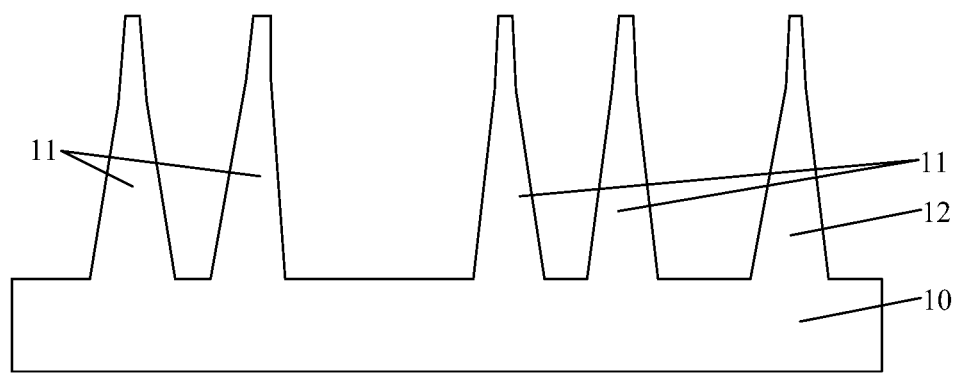
FIG. 1 illustrates a semiconductor structure.

FIG. 1 illustrates a semiconductor structure. The semiconductor structure includes a substrate 10 and discrete fins protruding from the substrate 10.

In an SRAM device having six-transistor (6T) semiconductor structure, the fins include first fins 11 for forming N-type devices and second fins 12 for forming P-type devices. Correspondingly, the pitches between each first fin 11 and the adjacent second fin 12 are different from the pitches between two adjacent first fins 11, and the pitches between two adjacent second fins 12.

The self-aligned double patterned process is usually used to form a hard mask layer when the pitches between the adjacent fins are different. Subsequently, a portion of the hard mask layer is removed and the remaining hard mask layer is used as the mask to form the substrate and the fins. However, the etching loading effect is likely to occur during the etching process for forming the fins, resulting in a poor symmetry in the profile of the fins. Correspondingly, the fins may bend due to the asymmetry of the strains on the two sides of each fin.

One solution to solve the problems due to the different pitches between the adjacent fins, a structure with equal-pitch fins may be formed. In this structure, the substrate and the discrete fins protruding from the substrate are formed by the self-aligned double patterned process. The substrate includes device regions and isolation regions, adjacent to one another. The pitches between two adjacent fins are same and the fins in the isolation regions may be later removed.

However, the etching process for removing the fins in the isolation regions may induce the lateral etching plasma damage to the fins in the adjacent device regions. As the etching process progresses, the damage to the fins in the device regions becomes more severe, resulting in limitations on the process for etching the fins in the isolation regions.

The present disclosure provides a semiconductor structure and its fabrication method. For example, the process for removing the fins from the isolation regions may be divided into two steps. In a first etching process, while removing a partial thickness of the fins in the isolation region, the lateral etching plasma damages to the fins in an adjacent device region is reduced. In a second etching process, the remaining fins in the isolation regions are etched using the remaining protective layer as the mask, and the remaining protective layer may protect the remaining fins in the device regions.

Compared to the process without forming the protective layer but removing the fins from the isolation regions by one step, use of the disclosed methods increases the etching process window for removing the fins from the isolation regions, and the removal effect of the fins from the isolation regions is improved. In addition, when etching the fins in the isolation region, the lateral etching plasma damages on the fins in the device regions adjacent to the isolation region may be reduced. As such, performance of the formed semiconductor structure is improved.

FIGS. 2-11 illustrate semiconductor structures corresponding to certain stages for forming an exemplary semiconductor structure according to various disclosed embodiments of present disclosure. FIG. 12 illustrates an exemplary method for forming a semiconductor structure according to various disclosed embodiments.

Figure 2:
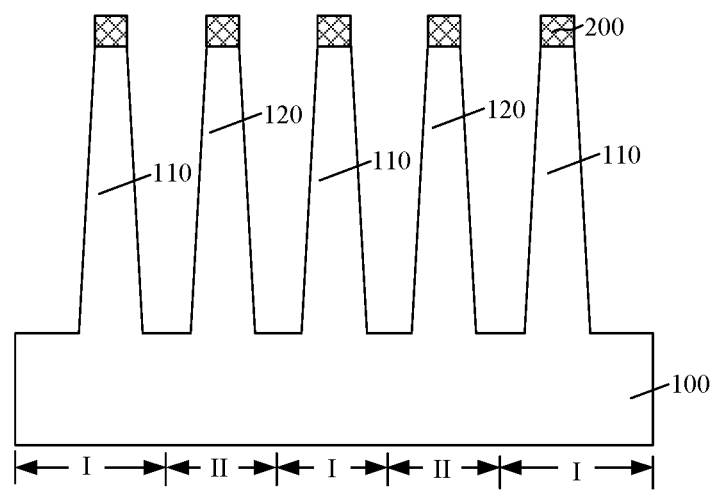
FIG. 2 to FIG. 11 illustrate semiconductor structures corresponding to certain stages for forming an exemplary semiconductor structure according to various disclosed embodiments of the present disclosure.

As illustrated in FIG. 2, a substrate 100 may be provided (e.g. in Step S802 in FIG. 12). The substrate 100 may include device regions I and isolation regions II, adjacent with one another. The substrate 100 may also include discrete fins protruding from the substrate 100 and the pitches between adjacent fins may be substantially same.

The substrate 100 may provide a platform for forming FinFETs.

In one embodiment, the substrate 100 in the device regions I and the isolation regions II may include discrete fins. The fins on the substrate 100 in the device regions I may be first fins 110 and the fins on the substrate in the isolation regions II may be second fins 120.

In some embodiments, an equal-pitch structure having substantially same pitches between the adjacent fins may be formed. As the fins may exist on the substrate 100 in both device regions I and isolation regions II and the pitches between the adjacent fins may be substantially same, the loading effect in plasma etching may be alleviated or eliminated. Subsequently, the formed fins may have better critical dimensions and profiles. Then the symmetry of the profiles of the fins may be improved, and the bending probability for the fins due to the asymmetry of the strain on two sides of the tins may be reduced.

The first fins 110 may be used as effective fins. The first fins 110 may be used to form the channels of the FinFET.

The second fins 120 may be used as sacrificial fins. The second fins 120 may be to-be-etched fins, which may be removed in the subsequent process. Subsequently, the pitches between the adjacent first fins 110 may increase and an isolation structure may be formed on the isolation regions II of the substrate 100 between the adjacent device regions I.

For illustration purposes, the present disclosure is described using an example that the device regions I and the isolation regions II are adjacent with one another and alternately arranged, although any suitable location relationship between the device regions I and the isolation regions II may be encompassed according to various embodiments of the present disclosure.

In various embodiments, the substrate 100 may be made of silicon, germanium, SiGe, SiC, GaAs, InGa, a silicon substrate on insulator, and/or a germanium substrate on the insulator. The substrate 100 may be made of materials which are appropriate for fabrication process or easy to be integrated with.

The fins may be made of materials same as the materials of the substrate 100. In various embodiments, the fins including the first fins 110 and the second fins 120 may be made of silicon, germanium, SiGe, SiC, GaAs, and/or InGa.

Multiple patterning processes may be used to reduce the critical dimensions of the fins and the pitches between the adjacent fins. Subsequently, the integration level of the formed semiconductor structure may be improved.

In one embodiment, the multiple patterning process may be a self-aligned double patterning (SADP) process.

The detailed process for forming the substrate 100 and the fins may include: for example, providing an initial substrate; forming a patterned core layer on the initial substrate; forming a spacer film to conformally cover the patterned core layer and the initial substrate; removing portions of the spacer film on the top of the patterned core layer and on the initial substrate, leaving portions of the spacer film on the sidewalls of the patterned core layer, as a fin mask layer 200 (illustrated in FIG. 2); removing the patterned core layer; etching the initial substrate to form the substrate 100 and the multiple discrete fins protruding from the substrate 100 by using the fin mask layer 200 as an etch mask.

In other embodiments, the multiple patterning process for forming the substrate and fins may be a self-aligned quadruple patterning process (SAQP).

In one embodiment, the fin mask layer 200 on the top of the fins may be retained after forming the substrate 100 and the fins. The fin mask layer 200 may be made of SiN. In a subsequent planarizing process, the top of the fin mask layer 200 may be used to determine the stop position of the planarizing process and protect the top of the fins.

In one embodiment, when forming the substrate 100 and the fins the top size of the fins may be smaller than the bottom size along a direction parallel to the surface of the substrate 100 and perpendicular to the extending (or length) direction of the fins.

Figure 3:
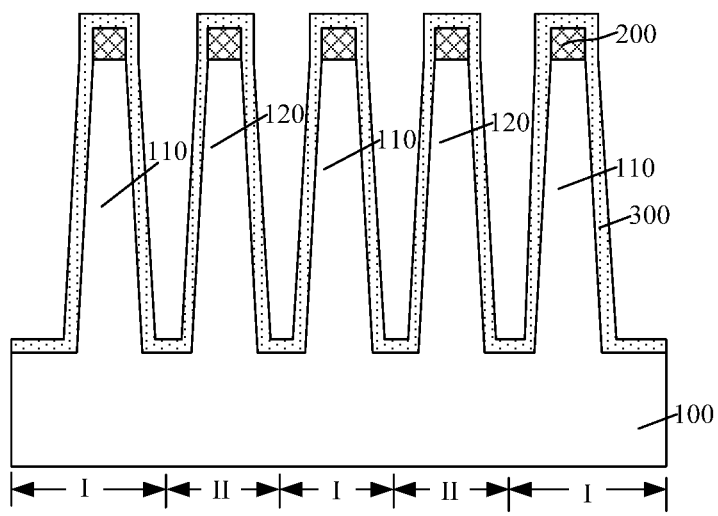

Referring to FIG. 3, a protective layer 300 is formed on the sidewalls of the fins (e.g. in Step S804 in FIG. 12).

The protective layer 300 may be subsequently used as an etch mask to etch the second fins 120 and may protect the first fins 110 adjacent to the fins 120 when etching the second fins 120, to reduce the lateral etching plasma damage to the first fins 110.

The protective layer 300 may be made of a material different from the fins and may be easy to be removed. Correspondingly, damages to the substrate 100 and remaining fins by the subsequent process for removing the protective layer 300 may be reduced. The protective layer 300 also may be made of a material different from the fin mask layer 200, so that the fin mask layer 200 may not be removed when subsequently removing the protective layer 300. In one embodiment, the protective layer 300 may be made of $SiO_2$.

In one embodiment, the protective layers 300 may be formed by an atomic layer deposition method. When forming the protective layer 300 on the sidewalls of the fins, the protective layer 300 may also be formed on the substrate 100 and on the top of the. Correspondingly, the protective layer 300 may protect the substrate 100 and reduce the etching damages to the substrate 100 in the subsequent etching process.

The protective layer 300 may be further formed on the top surface and the sidewalls of the fin mask layers 200 since the fin mask layers 200 are formed on the top of the fins, in the process for forming the protective layer 300.

The protective layer 300 should have an appropriate thickness. If the thickness of the protective layer 300 is too small, it may not be used as the etching mask in the subsequent etching process and also may not protect the first fins 110 effectively. Correspondingly, the first fins 110 may be easily damaged in the etching process. If the thickness of the protective layer 300 is too large, the protective layer 300 between the adjacent fins may merge together easily because the pitches between the adjacent fins are small, and the quality of the formed protective layer 300 may be reduced. In one embodiment, the thickness of the protective layers 300 may be about 10 Å to about 100 Å.

Figure 4:
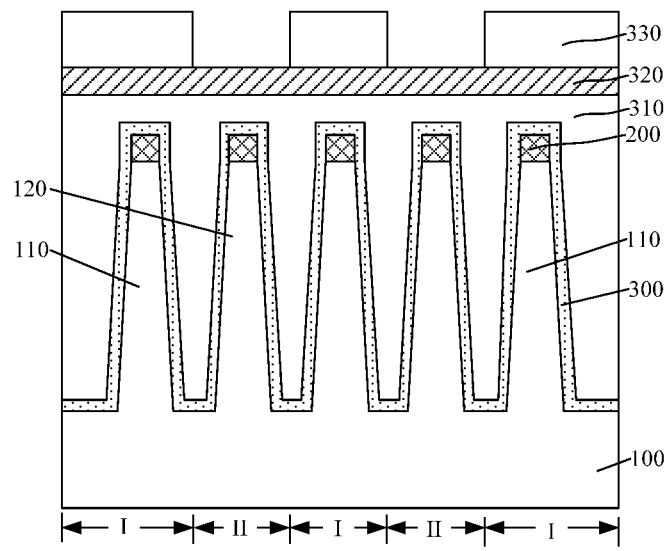
Figure 5:
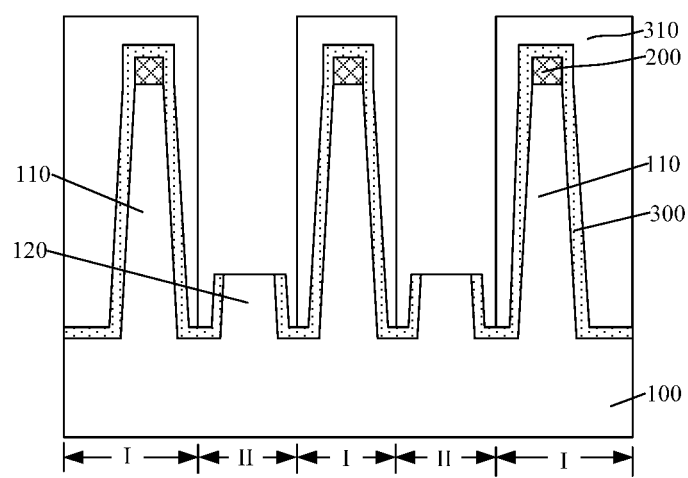

Referring to FIGS. 4-5, a first etching process is performed to remove a partial thickness of the fins in the isolation regions II along with a partial thickness of the protective layer on the fins in the isolation regions II (e.g. in Step S806 in FIG. 12).

For example, the first etching process may be used to remove a partial thickness of the second fins 120 in the isolation regions II along with a partial thickness of the protective layer on the fins in the isolation regions II.

The first etching process provides a foundation for a second etching process to remove the remaining second fins 120 subsequently and reduces the difficulties in the second etching process.

As illustrated in FIG. 4, before the first etching process, a planarizing layer 310 may be formed on the substrate 100 to cover the top of the fins. An -anti-reflective coating layer 320 may be formed on the planarizing layer 310. Subsequently, a patterned photoresist layer 330 may be formed on the anti-reflective coating layer 320 and the patterned photoresist layer 330 may have patterned openings to expose a top of the anti-reflective coating layer 320 in the isolation regions II. Then the anti-reflective coating layer 320 and the planarizing layer 310 in the isolation regions II may be etched along the patterned openings using the photoresist layer 330 as a mask.

The planarizing layer 310 may be further formed on the protective layer 300 since the protective layer 310 may be formed on the top and the sidewalls of the fins, and on the substrate 100.

The planarizing layer 310, the anti-reflective coating layer 320, and the patterned photoresist layer 330 may form a mask layer with a tri-layer structure and may be used as the mask layer of the first etching process.

A top surface of the planarizing layer 310 may be a planarizing surface. Correspondingly, when forming the patterned photoresist layer 330, the uniformity of the spin coating and the uniformity of the density of the patterned photoresist layer 330 may be improved. Accordingly, the pattern quality of the formed patterned photoresist layer 330 may be improved, too.

In one embodiment, the planarizing layer 310 may be made of carbon-doped organic bottom anti-reflective coating (BARC) layer. In other embodiments, the planarizing layer 300 may be made of a carbon coating layer by a spin coating method.

The anti-reflective coating layer 320 may be used to absorb the light refracted into the anti-reflective coating layer 320 during a photolithographic process for forming the patterned photoresist layer 330. Then the reflective rate of the light in a certain wavelength range by the anti-reflective coating layer 320. Correspondingly, the standing wave effect and the quality of the photoresist layer 330 after the exposure-development process may be improved, and the pattern transfer effect in the photolithography process also may be enhanced.

In one embodiment, the anti-reflective coating layer 320 may be made of a Si-doped bottom anti-reflective coating layer.

In the first etching process, a partial thickness of the protective layer 300 and the second fins 120 in the isolation region II may be etched using the photoresist layer 330 along with the remaining anti-reflective coating layer 320 and the planarizing layer 310 as the mask.

In one embodiment, the first etching process may be a plasma dry etching process.

In one embodiment, the first etching process may have similar etching rates to the protective layer 300 and to the second fins 120, by appropriately setting process parameters of the first etching process. Correspondingly, a partial thickness of the protective layer 300 and the second fins 120 may be etched away simultaneously, providing a foundation for continuous etching the remaining second fins 120 in the isolation regions II subsequently.

The first etching process should remove an appropriate amount of the second fins 120. Correspondingly, the remaining second fins 120 should have an appropriate height. It may be easy to cause etching plasma damage to the adjacent first fins 110 in the first etching process for etching the second fins 120, and the damage to the first fins 110 may be more severe if the etching amount of the second fins 120 is bigger in the first etching process. Correspondingly, the etching amount of the second fins in the first etching process should not be too large. If the etching amount of the second fins 120 is too small, it may be more difficult to etch the remaining second fins 120 in the second etching process. In one embodiment, the remaining second fins 120 after the first etching process in the isolation regions II may have a height of about 200 Å to about 500 Å.

In one embodiment, the process parameters of the first etching process may be set appropriately according to the etching rate and the target height of the remaining second fins 120 after the first etching process. In the first etching process, an etching gas may be a mixture of $N_2$ and $H_2$ or a mixture of $O_2$ and $CO_2$; an etching time may be about 60 s to about 600 s; a process pressure may be about 10 mTorr to about 50 mTorr; a source power may be about 300 W to about 800 W; and a bias power may be about 50 W to about 300 W.

As illustrated in FIG. 5, in one embodiment, after the first etching process, the photoresist layer 330 and the anti-reflective coating layer 320 may be removed.

In one embodiment, the photoresist layer 330 and the anti-reflective coating layer 320 may be removed by an ashing process or a wet etching process.

In one embodiment, the planarizing layer 310 may be preserved after removing the photoresist layer 330 and the anti-reflective coating layer 320. The planarizing layer 310 may protect the first fins 110 and the substrate 100 in the device regions I, to further reduce the etching damage to the first fins 110 and the substrate 100 in the device regions I in the subsequent second etching process.

In other embodiments, the planarizing layer 310 may be removed after removing the photoresist layer 330 and the anti-reflective coating layer 320.

Figure 6:
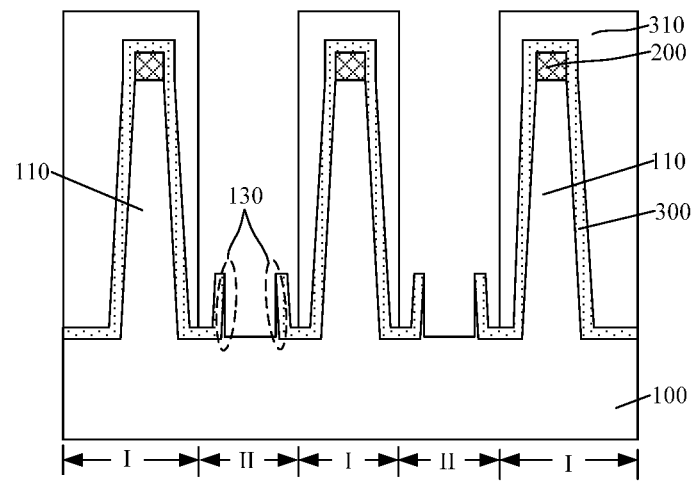
Figure 7:
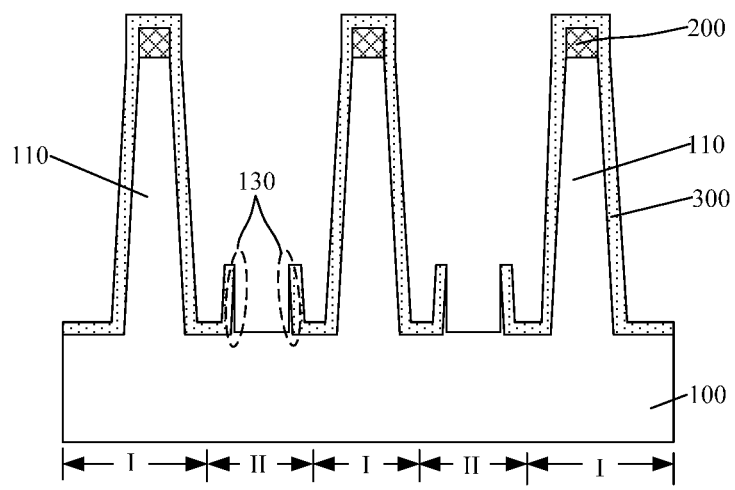

Referring to FIGS. 6-7, the remaining second fins 120 in the isolation regions II may be removed by the second etching process using the remaining protective layer 300 as a mask layer, to form dummy fins 130.

More specifically, the second etching process may be performed to remove the remaining second fins 120.

The second fins 120 may be used as the sacrificial fins. The remaining second fins 120 may be removed to provide a foundation to form the isolation structures on the substrate 100 in the isolation regions II.

In one embodiment, the first etching process may have a similar etching rate to the protective layer 300 and to the second fins 120, but the etch ratio of the second etching process may be larger compared to the first etching process. Correspondingly, the second etching process may have a larger etching rate to the second fins 120 than a etching rate to the protective layer 300 by appropriately setting the process parameters of the second etching process. Subsequently, the protective layer 300 may be used as the etching mask in the second etching process.

In one embodiment, the second etching process may be a plasma dry etching method, and the process parameter of the second etching process may be set according to the height of the remaining second fins 120 and should not affect the protective capability of the protective layer 300.

In one embodiment, in the second etching process, the etching gas may include $O_2$, $CF_4$, HBr or $Cl_2$; the process time may be about 30 s to about 300 s; the process pressure may be about 3 mTorr to about 12 mTorr; the source power may be about 200 W to about 800 W; and the bias power may be about 150 W to about 500 W.

In one embodiment, a portion of the second fins 120 may be still preserved after the second etching process. The remaining second fins 120 after the second etching process may be used as the dummy fins 130.

In one embodiment, the planarizing layer 310 may be formed in the device regions I and may protect the first fins 110 and the substrate 100 in the second etching process. Correspondingly, as illustrated in FIG. 7, the planarizing layer 310 may be removed after the second etching process.

In the process for forming the substrate 100 and the fins, the fins may have a smaller top size than a bottom size along the direction parallel to the surface of the substrate 100 and perpendicular to a extending direction of the fins, and sidewalls of the fins may be not perpendicular to the surface of the substrate 100. Correspondingly, a portion of the second fins 120 on the substrate 100 and on the sidewalls of the remaining protective layer 300 in the isolation regions II after the second etching process may be preserved as the dummy fins 130.

The dummy fins 130 may have a small size after the second etching process and may have a small influence on a quality and the insulating effects of the subsequent isolation structures.

The height of the dummy fins 130 may be determined by the etching amount of the second etching process. In one embodiment, a distance between the top of the dummy fins 130 to the top of the substrate 100 along the normal direction of the surface of the substrate 100 may be about 50 Å to about 500 Å.

Figure 8:
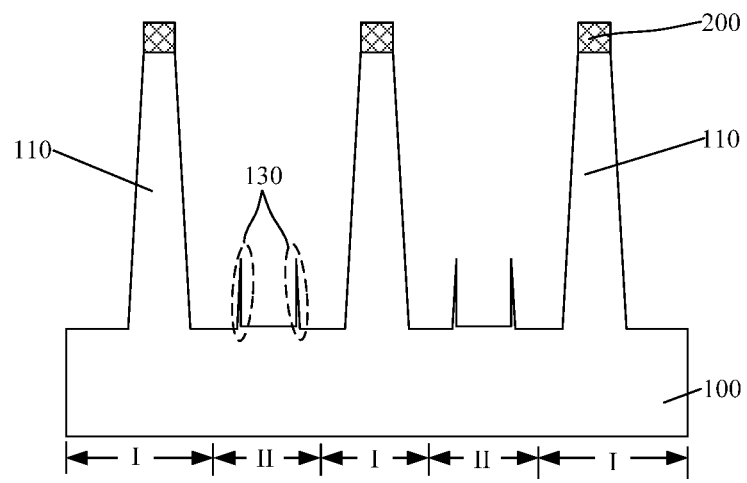

As illustrated in FIG. 8, the remaining protective layer 300 after the second etching process may be removed (e.g. in Step S810 in FIG. 12).

In one embodiment, the protective layer 300 may be removed by the wet etching process.

In one embodiment, the protective layer 300 may be made of $SiO_2$, and the wet etching process may use a HF solution as an etching solution. The process parameters of the wet etching process may be determined by an amount of the remaining protective layer 300.

Figure 9:
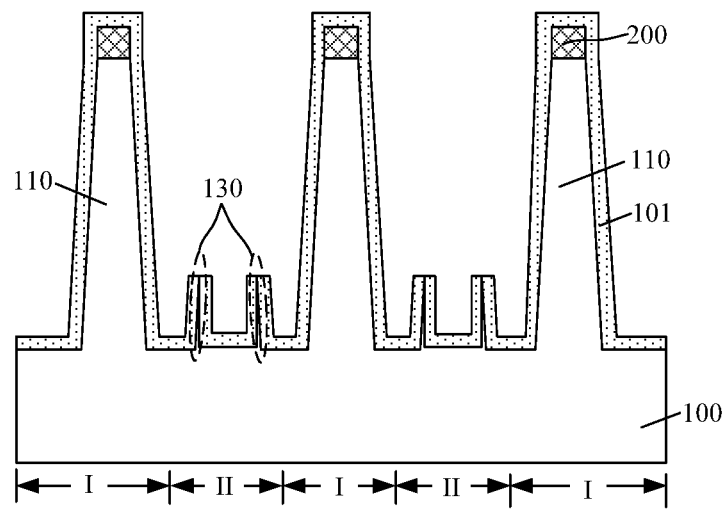

As illustrated in FIG. 9, after removing the protective layer 300, a liner oxide layer 101 may be formed on the surface of the remaining fins.

In one embodiment, the liner oxide layer may be formed on the surface of the first fins 110 and the dummy fins 130.

In one embodiment, the liner oxide layer 101 may be formed by an oxidation treatment to the fins.

The etching process for forming the substrate 100 and the fins may damage the fins. The forming of the liner oxide layer 101 may repair the damage and remove the lattice defects on the surface of the fins. The forming of the liner oxide layers 101 may also repair the protruding corners of the fins and may have the rounding treatment effect on the corners of the fins. Correspondingly, a tip discharge at the corners of the fins may be eliminated and the electric performance of the formed semiconductor structure may be improved.

In one embodiment, the oxidation treatment may also oxidize the surface of the substrate 100 and the fin mask layer 200. Correspondingly, the liner oxide layer 101 may further be formed on the surface of the substrate 100 and on the surface of the fin mask layer 200.

In one embodiment, the substrate 100 and the fins may be made of silicon, and the fin mask layer 200 may be made of SiN. Correspondingly, the materials of the liner oxide layer 101 on the surface of the substrate 100 and on the sidewalls of the fins may be $SiO_2$, while the materials of the liner oxide layer 101 on the fin mask layer 200 may be SiNO.

Figure 10:
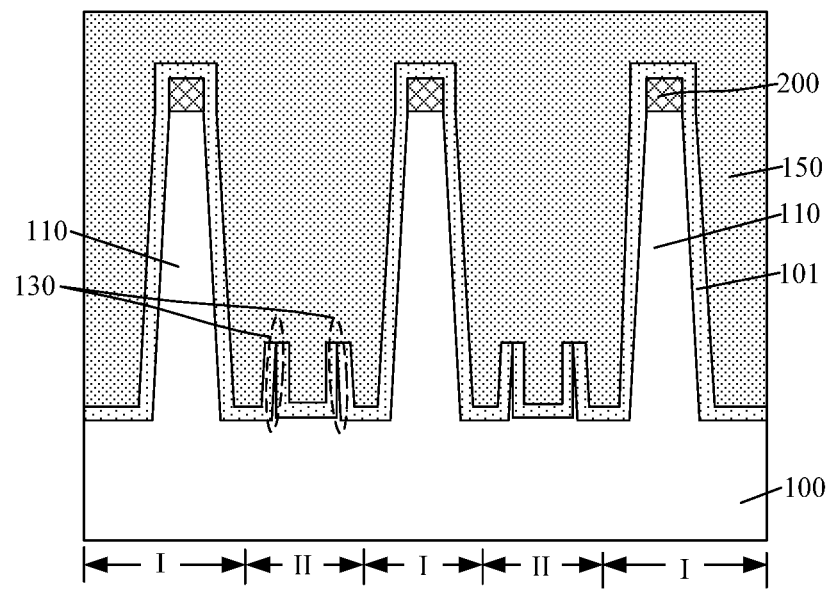
Figure 11:
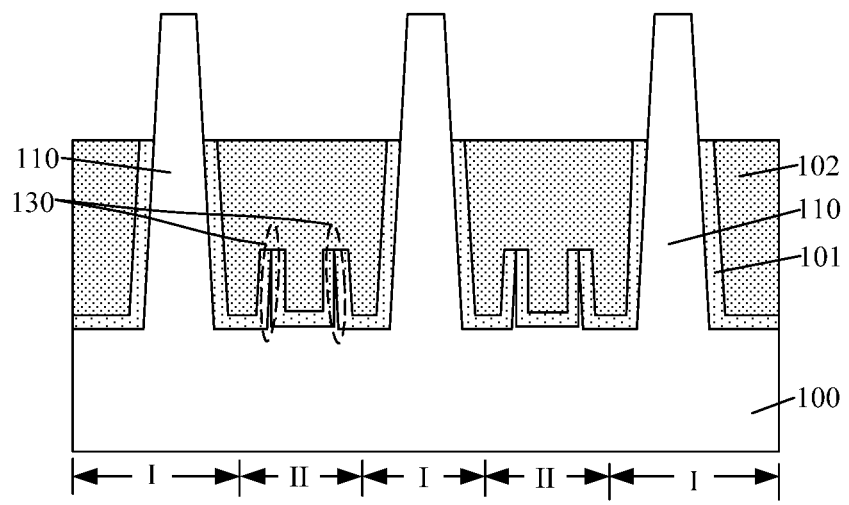
Figure 12:
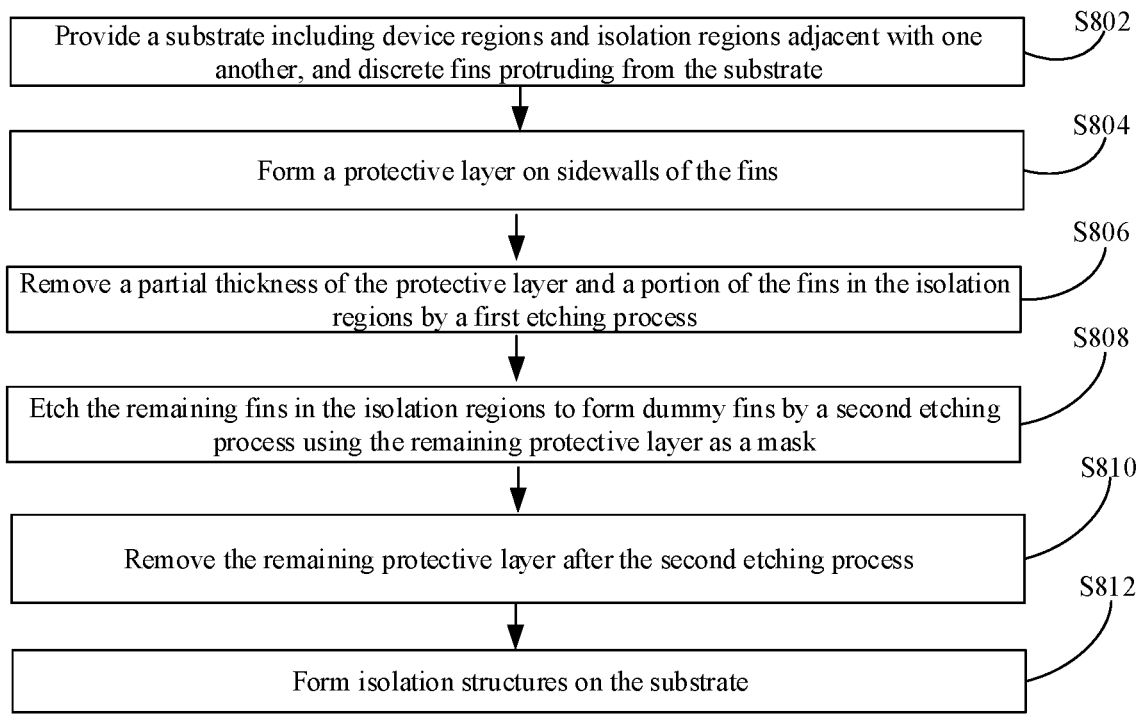
FIG. 12 illustrates an exemplary method for forming a semiconductor structure according to various disclosed embodiments.

Referring to FIGS. 10-11, isolation structures 102 shown in FIG. 11 may be formed on the substrate 100 after removing the protective layer 300 (e.g. in Step S812 in FIG. 12). The isolation structures 102 may have a top surface lower than a top of the fins in the device regions I but higher than a top of the dummy fins in the isolation regions II.

The isolation structures 102 may be used to isolate the adjacent devices or the adjacent fins in the formed semiconductor structure. In various embodiments, the isolation structures 102 may be made of $SiO_2$, SiN or SiNO.

The detailed process for forming the isolation structures 102 may include: forming an isolation film 150 on the substrate and covering the top of the first fins 110 in the device regions; removing a portion of the isolation film 150 above the top of the first fins 110 by a planarizing process;

and etching-back a partial thickness of the isolation film 150 to form the isolation structures 102.

To improve a filling effect of the isolation film 150, the isolation film 150 may be formed by a flowable chemical vapour deposition (FCVD), to make the isolation film 150 effectively filling spaces between the adjacent fins. Correspondingly, the probability of the appearance of the void in the isolation film 150 may be reduced and the formed isolation structures 102 may have better compactness. Further, the isolation film 150 should have a top higher than a top of the mask layers 200 in the process for forming the isolation film 150 since the mask layers 200 may be formed on the top of the first fins 110.

In one embodiment, the planarizing process to remove a portion of the isolation film 150 above the mask layers 200 may be a chemical mechanical polishing process and the stop position of the chemical mechanical polishing process may be the top surface of the mask layer 200. The fin mask layer 200 may be removed after the planarizing process.

In one embodiment, the wet etching process may be used to remove the mask layer 200. The fin mask layer 200 may be made of $SiO_2$ and the etching solution in the wet etching process may be a phosphoric acid solution.

The liner oxide layer 101 may be formed on the surface of the fins and on the surface the mask layers 200. Correspondingly, a portion of the liner oxide layer 101 on the mask layers 200 may be also removed when removing a portion of the isolation film 150 above the top of the first fins 110. The liner oxide layer 101 may be also etched back when etching back a portion of the isolation film 150. Subsequently, a portion of the liner oxide layer 101 higher than the top of the isolation structures 102 may be removed.

The etching amount when etching back a partial thickness of the isolation film 150 may be determined by the requirement of the actual process. In one embodiment, the first fins 110 exposed by the top of the isolation structures 102 in the device regions I may have a height of about 200 Å to about 800 Å.

In the present disclosure, the process parameters and the etching amount of the first etching process may be appropriately adjusted to reduce the lateral etching plasma damage on the first fins 110 adjacent to the second fins 120 when removing a partial thickness of the second fins 120. Subsequently, the process parameters of the second etching process may be adjusted appropriately to etch the remaining second fins 120 by using the remaining protective layer 300 as the mask. Compared to the process without forming the protective layer which removing the second fins in one step, the present disclosure may increase the etching process window for removing the second fins 120 and improve the efficiency of the process for removing the second fins 120. The lateral etching plasma damage on the adjacent first fins 110 also may be reduced when etching the second fins 120.

FIG. 3 illustrates a semiconductor structure provided by one embodiment of the present disclosure. The semiconductor structure may include: a substrate 100 including adjacent device regions I and isolation regions II; discrete fins protruding from the substrate 100 where pitches between adjacent fins are substantially same; dummy fins on the substrate in each isolation region, where the dummy fins have a top lower than an adjacent fin in the device region; and isolation structures in isolation region, on the substrate, and between fins in the device regions, where the isolation structure has a top lower than the fins in the device regions and higher than a top of the dummy fins in the isolation regions.

The substrate 100 may provide a platform for forming the FinFET.

In one embodiment, there are discrete fins on the device regions I and isolation regions II. The fins on the substrate 100 in the device regions I may be used as the first fins 110, and the fins on the substrate 100 in the isolation regions II may be used as the second fins 120.

The pitches between the adjacent fins may be substantially same, and the loading effect in plasma etching may be alleviated or eliminated when forming fins. Correspondingly, the formed fins may have better critical dimensions and profiles. Then the symmetry of the profiles of the fins may be improved and the bending probability for the fins due to the asymmetry of the strain on both sides of the fins may be reduced.

The first fins 110 may be used as the effective fins and may be used to form the channels of the formed FinFET.

The second fins 120 may be used as sacrificial fins and may be to-be-etched fins. Correspondingly, the pitches between the adjacent first fins 110 may increase and the isolation structure may be formed on the substrate 100 between the device regions I.

For illustration purposes, the present disclosure is described using an example that the device regions I and the isolation regions II are adjacent with one another and arranged alternatively, although any suitable location relationship between the device regions I and the isolation regions II may be encompassed according to various embodiments of the present disclosure.

In various embodiments, the substrate 100 may be made of silicon, germanium, SiGe, SiC, GaAs, InGa, a silicon substrate on insulator, and/or germanium substrate on the insulator. The substrate 100 may be made of a material which is appropriate for fabrication process or easy to be integrated with.

The fins may be made of materials same as the materials of the substrate 100. In various embodiments, the fins including the first fins 110 and the second fins 120 may be made of silicon, germanium, SiGe, SiC, GaAs, and/or InGa.

The semiconductor structure may further include a fin mask layer 200 on the top of the fins. The fin mask layer 200 may be used as a mask to form the substrate 100 and the fins, and also may be used to determine the stop position in the planarizing process for forming the isolation structures. In one embodiment, the fin mask layer 200 may be made of SiN.

The protective layer 300 may be used as a mask to etching the second fins 120, and may protect the first fins 110 adjacent to the second fins 120 when etching the second fins 120. Correspondingly, the lateral etching plasma damage on the first fins 110 may be reduced.

In one embodiment, the protective layer 300 may be formed by the atomic layer deposition method and may be further formed on the top surface and on the sidewalls of the fin mask layer 200.

The protective layer 300 may be made of a material different from the fins and may be easy to be removed. Correspondingly, damages to the substrate 100 and remaining fins by the subsequent process for removing the protective layer 300 may be reduced. The protective layer 300 also may be made of a material different from the fin mask layer 200, so that the fin mask layer 200 may not be removed when subsequently removing the protective layer 300. In one embodiment, the protective layer 300 may be made of $SiO_2$.

The protective layer 300 should have an appropriate thickness. If the thickness of the protective layer 300 is too small, it may not be used as the etching mask in the subsequent etching process and also may not protect the first fins 110 effectively. Correspondingly, the first fins 110 may be easily damaged in the etching process. If the thickness of the protective layer 300 is too large, the protective layer 300 between the adjacent fins may merge together easily because the pitches between the adjacent fins are small, and the quality of the formed protective layer 300 may be reduced. In one embodiment, the thickness of the protective layers 300 may be about 10 Å to about 100 Å.

In the present disclosure, the isolation regions II may be used to form the isolation structures between the semiconductor devices and the second fins may be the fins to be etched. Correspondingly, the process parameters of the second etching process may be adjusted appropriately to etch the remaining second fins 120 by using the remaining protective layer 300 as a mask. Compared to the process without the protective layer and removing the second fins in one step, the present disclosure may increase the etching process window for removing the second fins 120 and improve the efficiency of the process for removing the second fins 120. The lateral etching plasma damages on the adjacent first fins 110 also may be reduced when etching the second fins 120.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor structure, comprising:
   providing a substrate including device regions and isolation regions, adjacent with one another,
   providing discrete fins on the substrate, wherein pitches between adjacent fins are substantially same;
   forming a protective layer on sidewalls of the fins;
   removing, by a first etching process, a partial thickness of fins in the isolation regions along with a partial thickness of the protective layer on the fins in the isolation regions;
   forming dummy fins, by a second etching process, to etch the remaining fins in the isolation regions using the remaining protective layer as a mask;
   removing the remaining protective layer; and
   forming isolation structures in the isolation regions, on the substrate, and between fins in the device regions, wherein the isolation structures have a top lower than the fins in the device regions and higher than the dummy fins in the isolation regions, wherein forming the isolation structures includes:
      forming an isolation thin film on the substrate and covering the top of the fins in the device regions;
      removing a portion of the isolation thin film above the top of the fins in the device regions by a planarizing process; and
      etching-back a partial thickness of the isolation thin film after the planarizing process to form the isolation structures.

2. The fabrication method according to claim 1, wherein: the protective layer is made of a material including silicon oxide.

3. The fabrication method according to claim 1, wherein: the protective layer is formed by an atomic layer deposition method, and the protective layer is further formed on the substrate and on the top of the fins in addition to being formed on the sidewalls of the fins.

4. The fabrication method according to claim 1, wherein: the protective layer has a thickness of about 10 Å to about 100 Å.

5. The fabrication method according to claim 1, wherein: the first etching process is a plasma dry etching process, and wherein:
   an etching gas is a mixture of $N_2$ and $H_2$ or a mixture of $O_2$ and CO;
   an etching time is about 60 seconds to about 600 seconds;
   a process pressure is about 10 mTorr to about 50 mTorr;
   a source power is about 300 W to about 800 W; and
   a bias power is about 50 W to about 300 W.

6. The fabrication method according to claim 1, wherein: the remaining fins after the first etching process in the isolation regions have a height of about 200 Å to about 500 Å.

7. The fabrication method according to claim 1, wherein: the second etching process is the plasma dry etching process, and wherein:
   an etching gas includes O2, CF4, HBr, C12, or a combination thereof;
   a process time is about 30 s to about 300 s;
   a process pressure is about 3 mTorr to about 12 mTorr;
   a source power is about 200 W to about 800 W; and
   a bias power is about 150 W to about 500 W.

8. The fabrication method according to claim 1, wherein: a distance between the top of the dummy fins and the top of the substrate along a normal direction of the substrate surface is about 50 Å to about 500 Å.

9. The fabrication method according to claim 1, further including:
   forming a liner oxidation layer on the dummy fins, after removing the protective layer and before forming the isolation structures on the substrate.

10. The fabrication method according to claim 1, wherein: a height of the fins in the device regions exposed by the top of the isolation structures is about 200 Å to about 800 Å.

11. The fabrication method according to claim 1, wherein: the protective layer is removed by a wet etching process.

12. The fabrication method according to claim 1, wherein: the substrate and the discrete fins on the substrate are formed by one of a self-aligned double patterned process and a self-aligned quadropule patterned process.

13. A fabrication method of a semiconductor structure, comprising:
   providing a substrate including device regions and isolation regions, adjacent with one another,
   providing discrete fins on the substrate, wherein pitches between adjacent fins are substantially same;
   forming a protective layer on sidewalls of the fins;
   forming a planarizing layer on the substrate and covering the top of the fins;
   forming an anti-reflective coating layer on the planarizing layers;
   forming a patterned photoresist layer on the anti-reflective coating layer and exposing a top of the anti-reflective coating layer in the isolation regions;
   etching the anti-reflective coating layer and the planarizing layer using the patterned photoresist layer as a mask
   removing, by a first etching process, a partial thickness of fins in the isolation regions along with a partial thickness of the protective layer on the fins in the isolation regions;

forming dummy fins, by a second etching process, to etch the remaining fins in the isolation regions using the remaining protective layer as a mask;

removing the remaining protective layer; and forming isolation structures in the isolation regions, on the substrate, and between fins in the device regions, wherein the isolation structures have a top lower than the fins in the device regions and higher than the dummy fins in the isolation regions.

14. The fabrication method according to claim 13, wherein the first etching process includes:

etching the partial thickness of the protective layer and the partial thickness of the fins in the isolation regions by using the photoresist layer, the remaining anti-reflective coating layer and the planarizing layer as a mask.

15. The fabrication method according to claim 13, further including:

removing the photoresist layer and the remaining anti-reflective coating layer after the first etching process.

16. The fabrication method according to claim 13, wherein:

the protective layer is made of a material including silicon oxide.

17. The fabrication method according to claim 13, wherein:

the protective layer is formed by an atomic layer deposition method, and the protective layer is further formed on the substrate and on the top of the fins in addition to being formed on the sidewalls of the fins.

18. The fabrication method according to claim 13, wherein:

the protective layer has a thickness of about 10 Å to about 100 Å.

19. The fabrication method according to claim 13, wherein:

the first etching process is a plasma dry etching process, and wherein:

an etching gas is a mixture of $N_2$ and $H_2$ or a mixture of $O_2$ and CO;

an etching time is about 60 seconds to about 600 seconds;

a process pressure is about 10 mTorr to about 50 mTorr;

a source power is about 300 W to about 800 W; and a bias power is about 50 W to about 300 W.

* * * * *